(12) United States Patent
Berezin et al.

(10) Patent No.: US 6,724,426 B1
(45) Date of Patent: Apr. 20, 2004

(54) MULTI JUNCTION APS WITH DUAL SIMULTANEOUS INTEGRATION

(75) Inventors: Vladimir Berezin, La Crescenta, CA (US); Eric R. Fossum, La Crescenta, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/519,930

(22) Filed: Mar. 7, 2000

Related U.S. Application Data

(60) Provisional application No. 60/124,153, filed on Mar. 8, 1999.

(51) Int. Cl.⁷ .............................................. H04N 5/335
(52) U.S. Cl. ...................... 348/308; 348/294; 348/311
(58) Field of Search ................................ 348/302–308, 348/309–316, 294; 250/208.1; 257/230, 291, 239, 219, 448, 445

(56) References Cited

U.S. PATENT DOCUMENTS

| | | | |
|---|---|---|---|
| 6,310,369 B1 * | 10/2001 | Narabu et al. | 257/239 |
| 6,388,243 B1 * | 5/2002 | Berezin et al. | 250/208.1 |
| 6,486,503 B1 * | 11/2002 | Fossum | 257/215 |
| 6,624,850 B1 * | 9/2003 | Guidash | 348/308 |

* cited by examiner

*Primary Examiner*—Aung Moe
(74) *Attorney, Agent, or Firm*—Dickstein Shapiro Morin & Oshinsky LLP

(57) ABSTRACT

A new kind of pixel is formed of two floating diffusions of different sizes and different conductivity type. The two floating diffusions have different image characteristics, and hence form a knee-shaped slope.

21 Claims, 2 Drawing Sheets

MULTI JUNCTION APS WITH DUAL SIMULTANEOUS INTEGRATION

CROSS REFERENCE TO RELATED APPLICATIONS

This application claims benefit of U.S. Provisional application No. 60/124,153, filed Mar. 8, 1999.

BACKGROUND

Active pixel sensors are described in U.S. pat. no. 5,417,215. Higher charge and efficiency from these devices is desirable. In addition, different parameters and operations can benefit from different kinds of samples. For example, a short sampling period can provide the highest amount of dynamic range, while a longer sampling period can provide better resolution. Fossum and Yadid-Pecht have described one such system and "Wide Intrascene Dynamic Range CMOS APS Using Dual Sampling, IEEE Transactions On Electronic Devices, volume 44 page 1721–1723, October 1997. In that system, two signals are obtained using two different integration intervals.

SUMMARY

The present application teaches a new pixel design with dual floating diffusion regions, each of which is separately controlled. The two regions collectively provide dual integration, but do so in a way that increases sensitivity, allows dual dynamic range, and also provides multiple junctions for improved photocarrier detection.

DETAILED DESCRIPTION

FIG. 1 shows a first embodiment which is formed by a more standard CMOS fabrication process. There is a relatively large floating diffusion capacitance, which can tend to reduce the charge conversion gain. However, this system may be easier to make due to its use of a standard CMOS process, with the floating diffusion being on the surface.

An N-type well 100 is formed in the P-type substrate 105. A first floating diffusion region 110 is a P-type floating diffusion region formed on the surface, i.e., its top surface close to or touching the active oxide region 102. The P-type floating diffusion region 110 is connected to a P-type output transistor 115 and a P-type reset transistor 120. The reset transistor 120 connects to a P+−type diffusion region 125 which is biased, for example, to the voltage level of the drain voltage.

The second floating diffusion region 130 is an N-type floating diffusion region. Note that the second floating diffusion region 130 takes up a much smaller area then the first floating diffusion region, e.g. one fifth as much area.

The second floating diffusion region is N-type, and is connected to an N-type output transistor 135. An NMOS reset transistor 140 connects the floating diffusion region to N+ diffusion region 145, which can be connected to a supply voltage level. In this way, a P-type region is formed extending from the edge of the P-type floating diffusion 110 to the edge of the P-type diffusion 125. The N-type region, starting at floating diffusion 130, is separate from the P-type region. In addition, the N-type region can surround virtually the entire active P type region, and all of the P+ region.

This new pixel design needs two separate reset control lines, one for the NMOS reset transistor 140 and the other for the PMOS reset transistor 120. One column can be used for both output signals, e.g. with two select control lines. Alternately, two output columns can be used with one select line.

Note that since the size of the two different floating diffusion regions is different, they will store different amounts of charge. Therefore, the floating diffusion 110 can store more charge then the floating diffusion 135. Different integration periods for these two diffusion floating regions allow a flexible saturation exposure for each element. It also facilitates obtaining a highlighted compression knee sloped light transfer curve.

A second embodiment is shown in FIG. 2. In this embodiment, the P type diffusion region 200 is formed below the surface of the N-well 202. An overlying N region 215 is formed above the floating diffusion, covered by the active oxide. The N-well 202, in this embodiment, is arranged to be fully depleted. A second smaller floating diffusion region 205 is connected to the buried floating diffusion 200, and is connected to output transistor 115. In this way, there are three superimposed PN junctions: A first junction between the overlying N region:area 215 and the buried floating diffusion 200. Another PN junction is formed between the bottom of the floating diffusion 215 and the N region 202. The third PN junction is between the fully depleted N region 202, and the P type substrate 105. The capacitance for the floating N type diffusion can be reduced by this structure.

Although only a few embodiments have been disclosed and detailed above, other modifications are possible. All such modifications are intended to be encompassed within the following claims.

What is claimed is:

1. A sensor, comprising:
   a substrate of a first conductivity type;
   a semiconductor well of a second conductivity type in said substrate;
   a first floating diffusion of a first size, in contact with first semiconductor well;
   a second floating diffusion, separate from said first floating diffusion, and of a second size different from said first size, also in contact with said semiconductor well; and
   first and second output transistors, respectively connected to said first and second floating diffusions.

2. A sensor as in claim 1 wherein said first floating diffusion is larger than said second floating diffusion.

3. A sensor as in claim 1 wherein said floating diffusions are formed at a surface of the semiconductor well.

4. A sensor as in claim 1 wherein said first floating diffusion is formed below a surface of said semiconductor well, and forming an overlying semiconductor well region over said first floating diffusion.

5. A sensor as in claim 4 wherein said first and second floating diffusions have opposite conductivity types.

6. A sensor as in claim 1 wherein said first and second floating diffusions have opposite conductivity types.

7. A sensor as in claim 5 further comprising a reset element, which resets at least one of said floating diffusions.

8. A sensor as in claim 5 further comprising a third floating diffusion coupled to said second floating diffusion, and an output transistor coupled to said third floating diffusion, said third floating diffusion provided above said first floating diffusion and having a portion touching a surface of said semiconductor well.

9. A sensor as in claim 1 further comprising an active oxide covering a surface of said well.

10. A sensor as in claim 9 further comprising first and second reset transistors, respectively connected to said first and second floating diffusions, and providing a reset level thereto in response to a reset signal.

11. A sensor as in claim 1 wherein said sensor is a photosensitive sensor.

12. A sensor as in claim 11 further comprising a first PN junction between said floating diffusion and said semiconductor well, and a second PN junction between said semiconductor well and said substrate.

13. A sensor as in claim 11 wherein said substrate well and diffusions are formed to form three PN junctions to a path of incoming light.

14. A photosensor, comprising:
   a substrate of a first conductivity type;
   a first semiconductor well, of a second conductivity type formed within said first conductivity type substrate;
   a first floating diffusion of a first size and a first conductivity, formed in said semiconductor well;
   a second floating diffusion of said second conductivity type, also formed at least partly within said well, wherein one of said first and second floating diffusions is larger than the other of said first and second floating diffusions; and
   transistor connection elements, enabling connection to said first and second floating diffusions, to obtain outputs indicative of an amount of light collected thereby.

15. A photosensor as in claim 14 further comprising first and second reset elements, respectively connected to reset said first and second floating diffusions.

16. A photosensor as in claim 15 wherein said substrate is P-type, said semiconductor well is N-type, said first floating diffusion is P-type and said second floating diffusion is N-type.

17. A photosensor as in claim 14 wherein one of said floating diffusions surrounds the other of said floating diffusions.

18. A photosensor as in claim 16 wherein said second floating diffusion of N-type surrounds an area of P type material including said P-type first floating diffusion.

19. A photosensor as in claim 14 wherein said N-region is fully depleted.

20. A photosensor as in claim 14 wherein there are three PN junctions in the path of any light beam.

21. A method of converting light to a signal comprising:
   receiving the light simultaneously in a first floating diffusion of a first size and first conductivity type, and a second floating diffusion of a second size and second conductivity type, wherein the first floating diffusion is larger than the second floating diffusion and produces an output indicative of a different gradation of the incoming light; and
   sampling said first floating diffusion using a transistor of said first conductivity type and sampling the second floating diffusion using a transistor of said second conductivity type.

* * * * *

UNITED STATES PATENT AND TRADEMARK OFFICE
CERTIFICATE OF CORRECTION

PATENT NO.     : 6,724,426 B1              Page 1 of 1
DATED          : April 20, 2004
INVENTOR(S)    : Vladimir Berezin et al.

It is certified that error appears in the above-identified patent and that said Letters Patent is hereby corrected as shown below:

Column 1,
Line 30, before "DETAILED DESCRIPTION", please insert the following paragraphs:

-- BRIEF DESCRIPTION OF THE DRAWINGS

The foregoing and other advantages and features of the invention will become more apparent from the detailed description of exemplary embodiments of the invention given below with reference to the accompanying drawings, in which.

Figure 1:
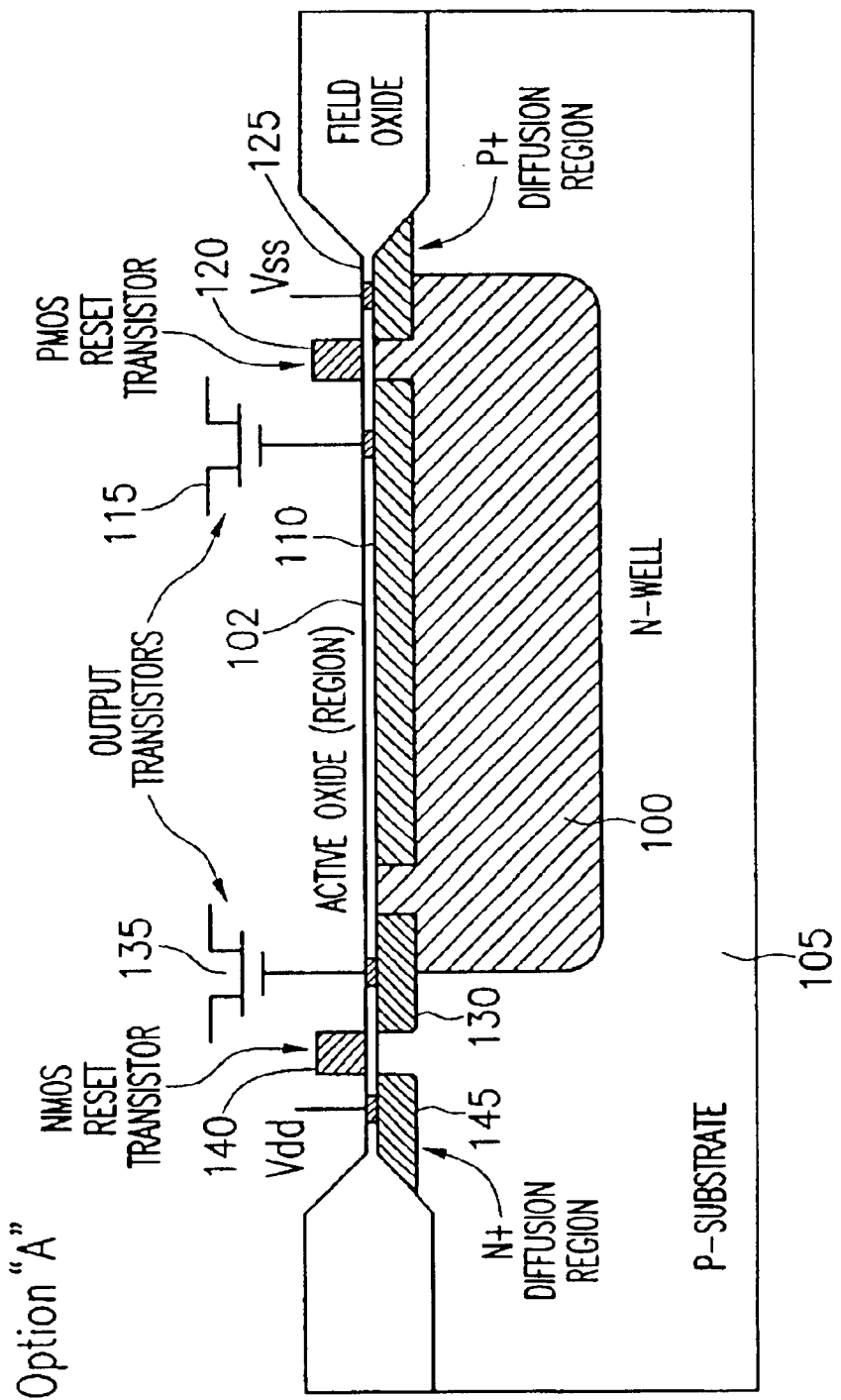
Fig. 1 is an illustration of a first embodiment of the invention.
Figure 2:
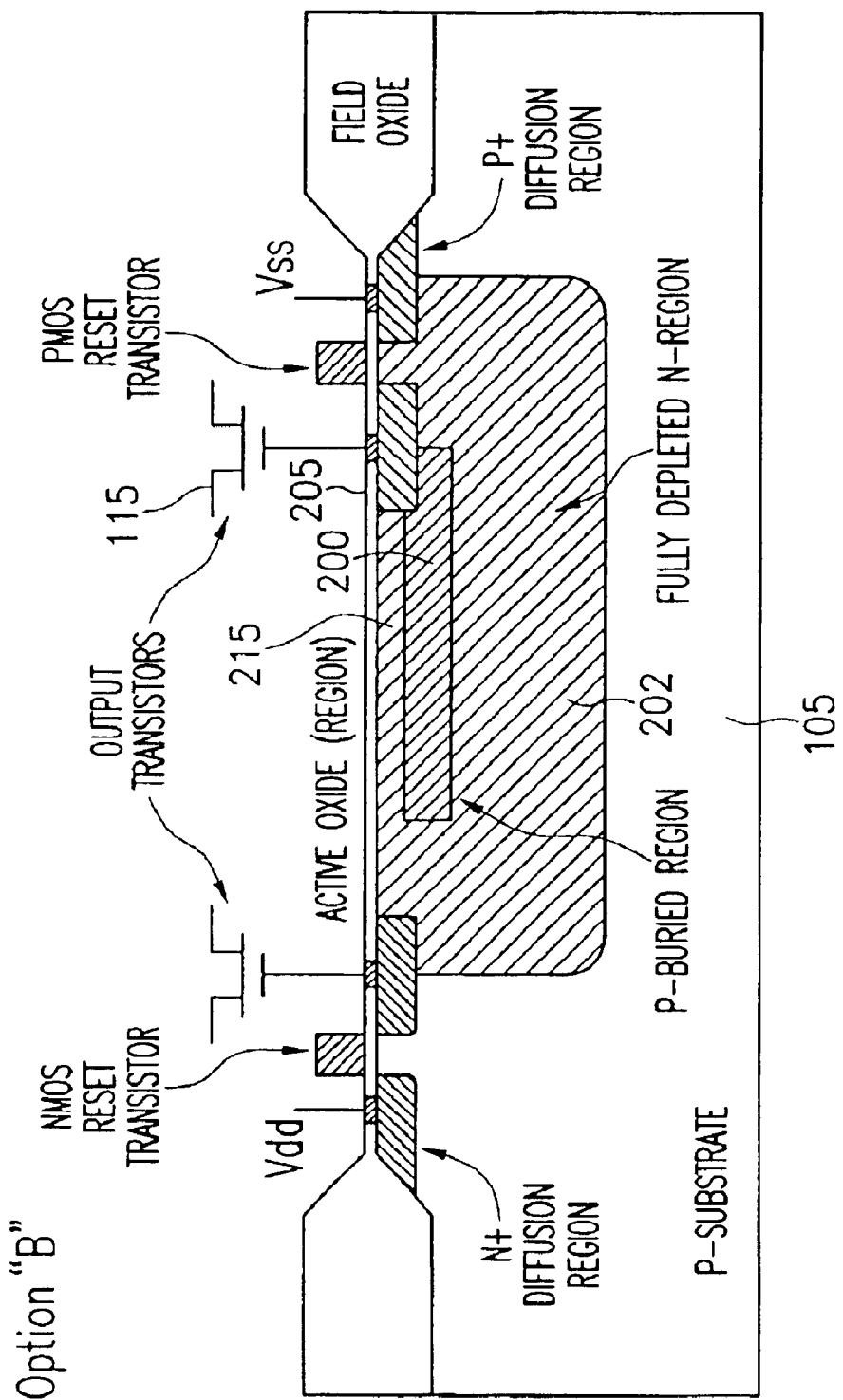
Fig. 2 is an illustration of a second embodiment of the invention. --.

Line 50, "130" should read -- 120 --;

Column 2,
Line 18, "region:area" should read -- region area --.

Signed and Sealed this

Eleventh Day of October, 2005

JON W. DUDAS
*Director of the United States Patent and Trademark Office*